United States Patent
Conte et al.

(10) Patent No.: US 11,908,514 B2
(45) Date of Patent: Feb. 20, 2024

(54) NON-VOLATILE PHASE-CHANGE MEMORY DEVICE INCLUDING A DISTRIBUTED ROW DECODER WITH N-CHANNEL MOSFET TRANSISTORS AND RELATED ROW DECODING METHOD

(71) Applicants: STMicroelectronics (Grenoble 2) SAS, Grenoble (FR); STMicroelectronics S.r.l., Agrate Brianza (IT)

(72) Inventors: Antonino Conte, Tremestieri Etneo (IT); Alin Razafindraibe, Saint Martin d'Hères (FR); Francesco Tomaiuolo, Acireale (IT); Thibault Mortier, Grenoble (FR)

(73) Assignees: STMicroelectronics S.r.l., Agrate Brianza (IT); STMicroelectronics (Grenoble 2) SAS, Grenoble (FR)

( * ) Notice: Subject to any disclaimer, the term of this patent is extended or adjusted under 35 U.S.C. 154(b) by 92 days.

(21) Appl. No.: 17/667,080

(22) Filed: Feb. 8, 2022

(65) Prior Publication Data
US 2022/0284954 A1 Sep. 8, 2022

(30) Foreign Application Priority Data
Mar. 3, 2021 (IT) .......................... 102021000004973

(51) Int. Cl.
*G11C 13/00* (2006.01)
(52) U.S. Cl.
CPC ........ *G11C 13/0028* (2013.01); *G11C 13/003* (2013.01); *G11C 13/0004* (2013.01); *G11C 2213/79* (2013.01)
(58) Field of Classification Search
CPC .................. G11C 8/08; G11C 13/0004; G11C 13/0028; G11C 7/065; G11C 7/22; G11C 7/18;
(Continued)

(56) References Cited

U.S. PATENT DOCUMENTS 5,440,518 A  8/1995  Hazani
2011/0280097 A1  11/2011  Bolandrina et al.
(Continued)

*Primary Examiner* — Thong Q Le
(74) *Attorney, Agent, or Firm* — Slater Matsil, LLP

(57) ABSTRACT

In an embodiment, a non-volatile memory device includes a memory array including a plurality of memory portions, each memory portion having a respective plurality of memory cells arranged in rows and columns, wherein the memory portions are arranged in groups, each group of memory portions having a plurality of respective memory portions arranged in a row and a plurality of respective wordlines that extend through the respective memory portions, and wherein the memory cells of the memory portions of the group are coupled to the respective wordlines and a row decoder including a pre-decoding stage configured to execute a selection, in which it selects a wordline that extends through a group of memory portions and deselects other wordlines that extend through the group of memory portions, and a subsequent deselection, in which it deselects all the wordlines that extend through the group of memory portions, wherein the row decoder further includes, for each group of memory portions, a shared pull-up stage configured to decouple from or couple to a node at a first reference potential each wordline that extends through the group of memory portions, when the wordline is respectively selected or deselected, so as to impose on each wordline, when deselected, a deselection voltage, a plurality of pull-down stages distributed along the group of memory portions, each pull-down stage being configured to locally couple each wordline that extends through the group of memory portions, when selected, to a node at a second reference potential, so as to impose locally a selection voltage on the wordline, wherein each pull-down stage is further configured to locally decouple from the node at the second reference potential each wordline that extends through the group of memory portions, when deselected; and a number (Continued)

of local pull-up stages distributed along the group of memory portions, each local pull-up stage having, for each wordline that extends through the group of memory portions, a corresponding local pull-up transistor of an NMOS type.

20 Claims, 4 Drawing Sheets

(58) Field of Classification Search
CPC ........ G11C 2207/104; G11C 2207/229; G11C 7/12; G11C 11/4091; G11C 7/04; G11C 11/406; G11C 8/10; G11C 13/003; G11C 16/08; G11C 2213/79; G11C 13/004; G11C 13/0069; G11C 11/404; G11C 11/4074; G11C 16/0483; G11C 16/10; G11C 16/24; G11C 13/0026; G11C 11/401; G11C 11/40618; G11C 11/4076; G11C 11/4087; G11C 11/4096; G11C 5/145; G11C 7/1006; G11C 7/1048; G11C 7/20; G11C 8/12; G11C 8/14; H10B 12/488; H10B 12/50; H01L 29/7841; H01L 21/76
USPC ..... 365/149, 190, 203, 189.09, 189.16, 201, 365/207, 222, 226, 185.08, 189.07, 194, 365/196, 202, 204, 205, 208, 230.03, 365/230.06, 233.11, 233.16, 51, 63, 69
See application file for complete search history.

(56) References Cited

U.S. PATENT DOCUMENTS

2019/0206488 A1    7/2019   Conte
2021/0183442 A1*   6/2021   Disegni ................... G11C 8/08

* cited by examiner

NON-VOLATILE PHASE-CHANGE MEMORY DEVICE INCLUDING A DISTRIBUTED ROW DECODER WITH N-CHANNEL MOSFET TRANSISTORS AND RELATED ROW DECODING METHOD

CROSS-REFERENCE TO RELATED APPLICATIONS

This application claims priority to Italian Patent Application No. 102021000004973, filed on Mar. 3, 2021, which application is hereby incorporated herein by reference.

TECHNICAL FIELD

The present invention relates to a non-volatile phase-change memory device including a distributed row decoder with n-channel MOSFET transistors; moreover, the present invention relates to a corresponding row-decoding method

BACKGROUND

As is known, in non-volatile memories of the phase-change type (the so-called PCM or ePCM, embedded Phase-Change Memory), the storage of information occurs by exploiting phase-change materials, which have the property of being able to switch between phases having a resistivity of a considerably different value. In particular, these materials may switch between an amorphous phase, with high resistivity, and a crystalline or polycrystalline phase, with low resistivity. Consequently, in a phase-change memory cell, it is possible to associate a different value of a data item stored in the cell for each phase (amorphous or crystalline) of a corresponding phase-change memory element.

For instance, it is possible to use, as phase-change memory elements, elements of Group VI of the Periodic Table, such as tellurium (Te), selenium (Se), or antimony (Sb), which are referred to as chalcogenides or chalcogenic materials. An alloy made up of germanium (Ge), antimony (Sb) and tellurium (Te), known as GST (having the chemical composition $Ge_2Sb_2Te_5$) currently finds widespread use in these memory elements.

The phase switching in a memory element may be obtained by increasing locally the temperature of the region of phase-change material, for example by causing passage of an electrical programming current through resistive electrodes (generally known as heaters) arranged in contact with the region of phase-change material. This electrical current, by the Joule effect, generates the temperature profile required for the phase change.

In particular, when the phase-change material is in the high-resistivity amorphous state (the so-called RESET state), the application of a first current pulse (the so-called SET pulse) is required having a duration and an amplitude such as to allow the material to cool off slowly. When subjected to this treatment, the phase-change material changes its state and switches from the high-resistivity state to a low-resistivity crystalline state (the so-called SET state). Instead, when the phase-change material is in the SET state, the application of a second current pulse (RESET pulse) having a high amplitude and a short duration is required so as to cause the material to return into the high-resistivity amorphous state.

Reading of the data item stored in the memory cell may be performed by applying to the memory element of phase-change material a voltage sufficiently low as not to cause considerable heating thereof, and then by reading the value of the current that flows in the memory cell. Given that the current is proportional to the conductivity of the phase-change material, it is possible to determine in which phase the material is, and thus deduce the data item stored in the memory cell.

In particular, a reading architecture for PCM memory devices of a differential type is known, in which two memory cells of opposite state are associated to each bit of a word to be read (which is made up, in a known way, of a suitable number of bits). For instance, a bit has the value "1" if a first memory cell (the so-called direct cell) and a second memory cell (the so-called complementary cell) associated to the bit are in the SET state and in the RESET state, respectively, and has the value "0" if the first and second memory cells are in the RESET state and in the SET state, respectively. The reading architectures of a differential type afford advantages in terms of reliability in so far as the data item is stored in a redundant way, and moreover do not require generation of a reference current in so far as reading is performed simply by comparing the respective currents that flow in the cells associated to a same bit.

The memory cells are organized in a memory array, and in particular are arranged in rows formed by wordlines and columns formed by bitlines (BL).

As illustrated schematically in FIG. 1, each memory cell 2 comprises a phase-change element 2a and a selector element 2b, for example a MOSFET transistor or (as illustrated in FIG. 1) a BJT transistor, electrically connected to the heater associated to the phase-change element 2a (not illustrated), so as to selectively enable the passage of an electrical programming or reading current.

In the case of selector elements of a BJT type, the phase-change element 2a is coupled between the emitter terminal of the BJT transistor, in the example of a pnp type, of the respective selector element 2b and a respective bitline BL; furthermore, the base terminal of the selector element 2b is electrically coupled to a respective wordline WL. The base terminals of the selector elements 2b of the memory cells 2 of a same row are coupled to a same wordline WL, and the phase-change elements 2a of the memory cells 2 of a same column are coupled to a same bitline BL. The collector terminals of the BJT transistors of the selector elements 2b are set at a reference voltage, for example at the ground reference voltage GND.

Use of selector elements 2b of a BJT type affords some advantages over MOSFET technology, such as a reduction of the overall area occupied by the memory cells 2 and a greater density of integration of the memory device. However, use of selector elements of a BJT type requires, as compared to the use of MOSFET transistors, a careful consideration of the base currents of the respective BJT transistors, which flow along the wordlines WL and can determine undesired voltage drops along the wordlines WL themselves. In particular, when the wordlines WL are not addressed (i.e., when they are deselected), they are biased at a high biasing voltage, which can cause a high leakage current towards the base terminals of the BJT transistors, with consequent variation of the voltage along the wordlines WL, as well as consequent high power consumption by the charge pump (not illustrated) that is designed to generate the aforesaid biasing voltage.

In this connection, FIG. 2 shows a memory array 3 of a memory device 1, of the phase-change type, the memory cells 2 of which are coupled to respective wordlines WL (aligned in a rows) and respective bitlines BL (aligned in columns). The phase-change elements 2a of the memory cells 2 are here represented schematically by respective resistor elements.

In particular, FIG. 2 shows the parasitic resistances (or line resistances) associated to the bitlines BL, designated by $R_{BL}$, and to the wordlines WL, designated by $R_{WL}$; the parasitic base resistances of the BJT transistors of the selector elements 2b of the memory cells 2 are moreover indicated, designated by $R_B$.

In the example illustrated in FIG. 2, the base terminals of the selector elements 2b of a same row are coupled to a same metallization line, which is contacted at regular intervals, in the example every four memory cells 2, by a respective wordline WL (in this example, the wordlines WL are arranged at a higher metallization level than the base metallization lines, in the layout of the memory array 3).

The memory device 1 further comprises, as illustrated schematically, a row decoder 4 and a column decoder 5, which are configured to address and bias in an appropriate way the wordline WL and, respectively, the bitline BL each time selected for the storage operations (programming and reading).

In particular, during the programming (or writing) and reading operations, a wordline WL, addressed and selected, is typically biased at the ground reference voltage GND (in the example, the BJT transistors are of a pnp type); when not selected, the same wordline WL is instead biased at a positive voltage, of appropriate value.

Along a wordline WL selected there therefore circulates an electrical current (with a value, which may even be high, that depends upon the operation carried out), which brings about a line voltage drop on account of the resistances associated to the same wordline WL (which are constituted by the ensemble of the parasitic line resistances $R_{WL}$ and base resistances $R_B$). Consequently, the biasing conditions of the memory cells 2 vary along a same wordline WL, as a result of the voltage drop, according to the position occupied in the memory array 3.

To limit this drawback, a division of the memory array 3 into portions, the so-called tiles, has been proposed, each tile comprising a certain number (for example, equal to 256, 512 or 1024) of local wordlines and local bitlines, which constitute portions of respective rows and columns of the entire memory array 3. In this case, the words selected are made up of a certain number of bits distributed on different tiles so as to limit the number of memory cells selected and, consequently, the effect of the voltage drop on the wordline, within each tile. This solution envisages operations of multiplexing in reading and operations of row-address decoding that will enable selection of the memory cells 2 addressed in the various tiles in order to reconstruct the data word.

For instance, FIG. 3 shows a portion of the memory array 3 of the memory device 1, which comprises a group of five tiles, set alongside one another in a same row; each tile (designated by 6) is formed, as indicated previously, by a certain number of memory cells, arranged in local wordlines WL and local bitlines BL (here not illustrated).

The row decoder 4 in this case comprises: a main a row-decoding unit 8, associated to the group of tiles 6 and configured so as to supply address-decoding and biasing signals, on the basis of address signals received at input; and a number of local row-decoding units 9, one for each tile 6 of the group, coupled to the main row-decoding unit 8. In particular, the aforesaid local row-decoding units 9 perform the function of selecting the wordlines WL locally, i.e., of bringing the wordlines WL to the ground reference voltage GND, within the respective tile 6.

The column decoder 5 in this case comprises a plurality of local column-decoding units 10, one for each tile 6, which enable selection and biasing of the local bitlines BL, associated to which are the memory cells that have to be read, and their connection to respective sense amplifiers (SA) ii, which are configured for the comparison of the reading currents of the (direct and complementary) memory cells associated to each bit of the data word.

In the example, 32 memory cells are read (i.e., 16 data bits, in view of the differential nature of the reading operation) for each tile 6, so that sixteen sense amplifiers 11 are present for each tile 6; the resulting reading is made up of a double word, each word being constituted by 32 data bits plus 7 error-correction-code (ECC) bits plus 1 redundancy bit. Consequently, 40+40 bits corresponding to 2 words are read in all, which correspond to 160 cells addressed physically.

In general, the number of memory cells read within each tile 6 depends upon the maximum voltage drop that can be sustained on the wordline WL; for example, in the case illustrated, reading of 32 memory cells can entail a voltage drop of approximately 100 mV on the local wordline WL of the tile 6.

An example of row-decoding architecture for a non-volatile memory device including a plurality of tiles is described in US Patent Application Publication No. 2019/0206488. This architecture envisages that, in each tile, each wordline WL of the tile is coupled to a pull-up stage formed by PMOS transistors. This solution is particularly advantageous in the case where the PMOS transistors are low-voltage transistors (for example, obtained in SOI technology with a channel length of 0.18 μm and capable of sustaining voltages in the region of 1.6 V), so as to contain the area occupied by the pull-up stages associated to the tiles. These low-voltage transistors can conduct high currents even with relatively low gate-to-source voltages and therefore enable, inter alia, fast deselection of the wordline WL even in the case where the voltage that is set on the wordline WL is relatively low, this rapidity being particularly useful during reading. However, the limitation on the type of PMOS transistors that can be used can prove excessively restrictive for a large number of applications. In fact, it is for example possible that, for some applications, it is required to use transistors of a different type, such as transistors capable of operating at a higher voltage (for example, equal to 3.6 V), in order to reduce the costs or meet constraints imposed by the manufacturing processes. These transistors are characterized by a greater channel length and a greater thickness of the gate oxide and, in order to conduct current in a satisfactory way, have to be biased at high voltages or else must have a greater channel width. Consequently, in this case, known solutions are not satisfactory since they require a high consumption of area and/or setting of the wordline WL, when deselected, at a high voltage, with consequent high leakages, both static and dynamic.

SUMMARY

Embodiments provide a row-decoding architecture for a non-volatile memory device, in particular of the phase-change type, that will overcome the drawbacks of the prior art.

BRIEF DESCRIPTION OF THE DRAWINGS

For a better understanding of the present invention, preferred embodiments thereof are now described, purely by way of non-limiting example, with reference to the attached drawings, wherein.

DETAILED DESCRIPTION OF ILLUSTRATIVE EMBODIMENTS

Figure 1:
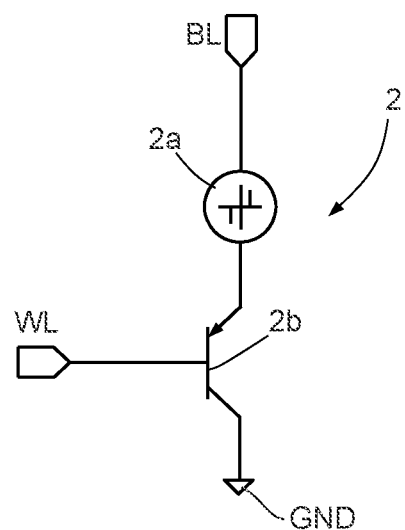
FIG. 1 is a schematic illustration of a memory cell of the phase-change type, of a known type.
Figure 3:
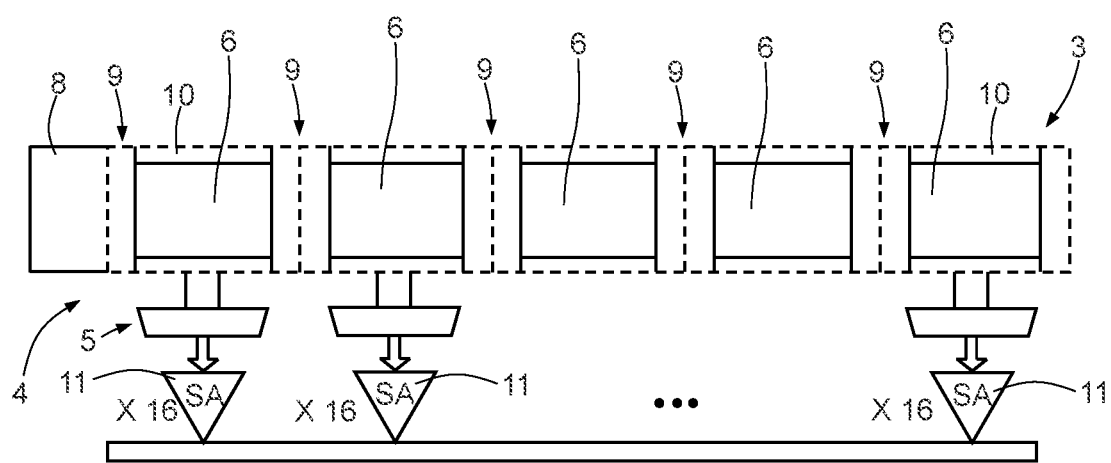
FIG. 3 shows a portion of a memory array of a non-volatile memory device of a known type, divided into tiles.
Figure 2:
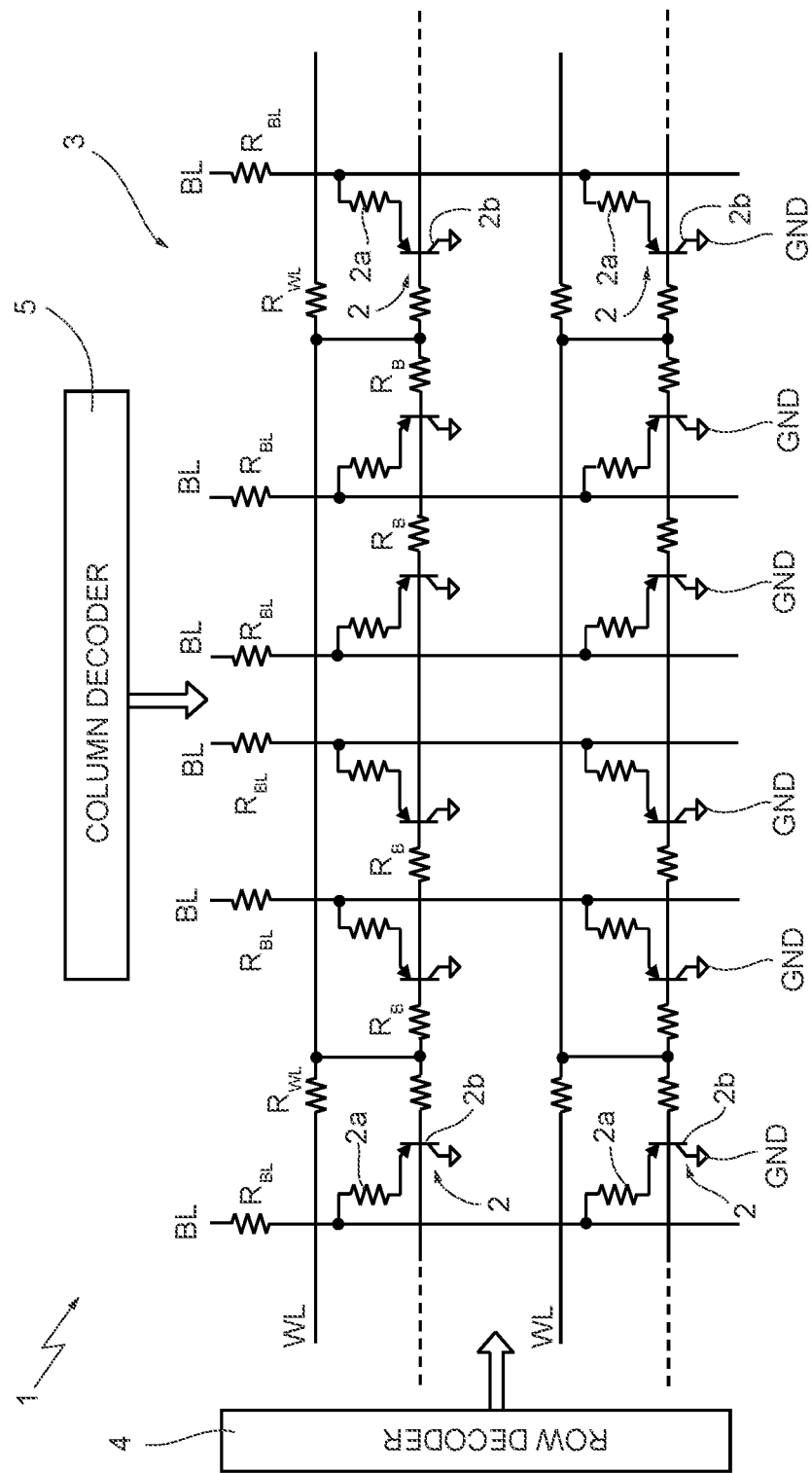
FIG. 2 is a schematic illustration of a portion of a memory array of a non-volatile memory device, of a known type.
Figure 4:
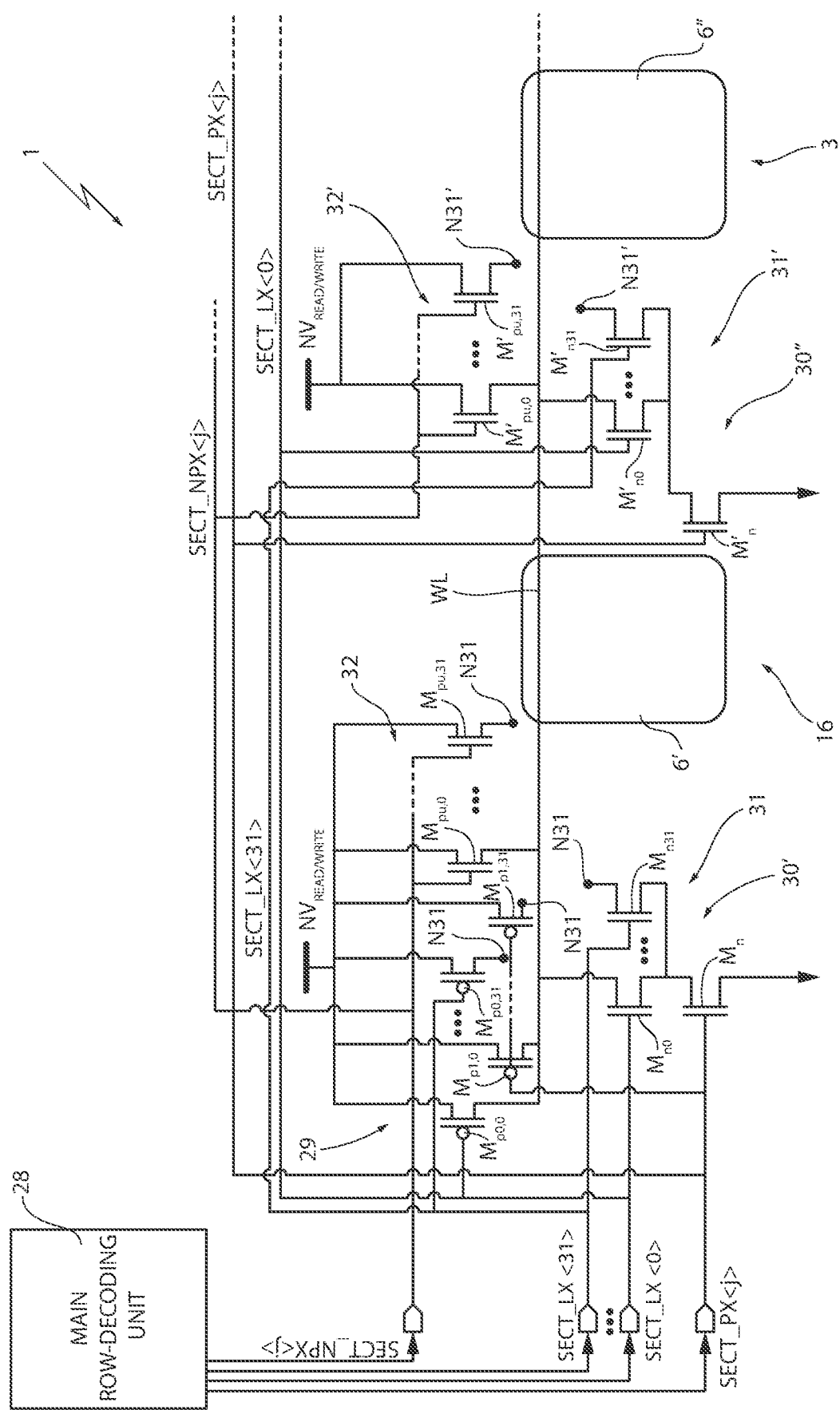
FIG. 4 shows a circuit diagram of a portion of the present non-volatile memory device. It shows a portion of a memory array of a non-volatile memory device. The non-volatile memory device is of the phase-change type and includes the memory cells illustrated in FIG. 1.

In a way similar to what has been mentioned previously, the memory array 3 is divided into portions, the so-called tiles; in particular, illustrated in FIG. 3 are a first tile and a second tile, designated, respectively, by 6' and 6", which form part of a group of tiles 16 (for example, including five tiles), which are arranged on a same row and are jointly subjected to an operation of reading of a word made up of a certain number of bits. The memory array 3 comprises a plurality of groups of tiles (only one of which is visible in FIG. 4), arranged in columns. Moreover, illustrated in FIG. 4 is a single wordline WL, which extends with ohmic continuity through the group of tiles 16, and then also through the first and second tiles 6', 6". Without this implying any loss of generality, in what follows it is assumed that each tile is traversed by 1024 wordlines, which are grouped in thirty-two subsets of wordlines WL, each subset thus including thirty-two wordlines WL. In what follows, the present description will refer to a single subset of thirty-two wordlines WL that extend through the group of tiles 16, and more precisely through five portions of tiles aligned with one another (in other words, through a group of portions of tiles arranged in a row), except where otherwise specified. Moreover, the wordline WL illustrated in FIG. 4 is the first of the thirty-two wordlines WL of the subset of thirty-two wordlines WL that is considered in the present description.

The non-volatile memory device 1 comprises a main row-decoding unit 28, which is designed to generate address-decoding signals, on the basis of address signals received at input (not illustrated), as described in greater detail hereinafter. In other words, the main row-decoding unit 28 functions as predecoding unit.

Furthermore, the non-volatile memory device 1 comprises, for each group of tiles, a shared pull-up stage 29 and a number of local row-decoding stages that are the same as one another and equal to the number of tiles present in the group of tiles 16, each local row-decoding stage being associated to a corresponding tile; in particular, illustrated in FIG. 4 are a first row-decoding stage and a second local row-decoding stage, designated, respectively, by 30' and 30" and associated, respectively, to the first and second tiles 6', 6". Also the shared pull-up stage 29 and the first and second local row-decoding stages 30', 30" are described with reference to the single subset of thirty-two wordlines WL.

In greater detail, the shared pull-up decoding stage 29 comprises a number of PMOS transistors (for example, enrichment) equal to the number of wordlines WL of the subset of wordlines WL; in the example illustrated in FIG. 4, these PMOS transistors therefore number thirty-two and are designated, respectively, by $M_{p0,0}$-$M_{p0,31}$ (only the transistors $M_{p0,0}$ and $M_{p0,31}$ are illustrated in FIG. 4). In what follows the PMOS transistors $M_{p0,0}$-$M_{p0,31}$ are referred to as to as the wordline-deselection transistors $M_{p0,0}$-$M_{p0,31}$.

With reference to the k-th wordline-deselection transistor $M_{p0,k}$ (with k=1, 2, . . . , 31), the respective source terminal is connected to a node $NV_{read/write}$, whereas the respective drain terminal is connected to the corresponding wordline WL, i.e., to the k-th wordline WL that traverses the group of tiles 16; moreover, present on the gate terminal of the k-th wordline-deselection transistor $M_{p0,k}$ is an address-decoding signal SECT_LX<k>, generated by the main row-decoding unit 28. Likewise illustrated in FIG. 4 is a node $N_{31}$, which is in contact with the thirty-second wordline WL.

The shared pull-up stage 29 further comprises, for each wordline WL of the subset of wordlines WL, a further PMOS transistor $M_{p1,k}$, for example of the same type as the wordline-deselection transistors $M_{p0,0}$-$M_{p0,31}$. In what follows, the PMOS transistors $M_{p1,0}$-$M_{p1,31}$ are referred to as the group-deselection transistors $M_{p1,0}$-$M_{p1,31}$.

In greater detail, considering the k-th wordline WL, the source and drain terminals of the corresponding group-deselection transistor $M_{p1,k}$ are connected, respectively, to the node $NV_{read/write}$ and to the k-th wordline WL; moreover, present on the gate terminal of the k-th group-deselection transistor $M_{p1,k}$ is an address-decoding signal SECT_PX<j>, generated by the main row-decoding unit 28. In particular, with reference to the address-decoding signal SECT_PX<j>, the index j indexes the thirty-two subsets of wordlines WL that traverse the group of tiles 16; in this connection, it is anticipated that the thirty-two address-decoding signals SECT_PX<j> are activated one at a time, so as to select the corresponding subset of wordlines WL. Selection of the individual groups of tiles is performed by using further address-decoding signals, in a per se known manner and therefore not described any further; the present description will therefore refer just to the group of tiles 16, except where otherwise specified.

As concerns the local row-decoding stages, described in what follows is the first local row-decoding stage 30', associated to the first tile 6'. As regards the second local row-decoding stage 30", associated to the second tile 6", the respective components are denoted in the same way as the components of the first local row-decoding stage 30', with the addition of a superscript. Also in this case, the description refers to a single subset of thirty-two wordlines WL, except where otherwise specified.

In detail, the first local row-decoding stage 30' comprises a local pull-down stage 31 and a local pull-up stage 32.

The local pull-down stage 31 comprises a group-selection transistor $M_n$, which is an NMOS transistor (enrichment transistor), and a number of further NMOS transistors equal to the number of wordlines WL of the subset of wordlines WL, which are, for example, of the same type as the group-selection transistor $M_n$. In the example illustrated in FIG. 4, said NMOS transistors therefore number thirty-two and are designated, respectively, by $M_{n0}$-$M_{n31}$ (only the transistors $M_{n0}$ and $M_{n31}$ are illustrated in FIG. 4). In what follows, the NMOS transistors $M_{n0}$-$M_{n31}$ are referred to as the wordline-selection transistors $M_{n0}$-$M_{n31}$.

In greater detail, the source terminals of the wordline-selection transistors $M_{n0}$-$M_{n31}$ are connected to the drain terminal of the group-selection transistor $M_n$, the source terminal of which is connected to the ground reference voltage GND. Present on the gate terminal of the group-selection transistor $M_n$ is the address-decoding signal SECT_PX<j>. Moreover, considering the k-th wordline-selection transistor $M_{nk}$, the respective drain terminal is connected to the k-th wordline WL.

The local pull-up stage 32 of the first local row-decoding stage 30' comprises, for each wordline WL of the subset of wordlines WL, a corresponding NMOS transistor $M_{pu,k}$ (in FIG. 4 only the transistors $M_{pu,0}$ and $M_{pu,31}$ are illustrated), which is, for example, of the same type as the group-selection transistor $M_n$ and is referred to in what follows as the additional pull-up transistor $M_{pu,k}$.

The drain and source terminals of the k-th additional pull-up transistor $M_{pu,k}$ are connected, respectively, to the node $NV_{read/write}$ and to the k-th wordline WL; present on the gate terminal of the k-th additional pull-up transistor $M_{pu,k}$ is an address-decoding signal SECT_NPX<j>, generated by the main row-decoding unit 28 and equal to the logic negation of the aforementioned address-decoding signal SECT_PX<j>.

The address-decoding signals SECT_PX, SECT_NPX and SECT_LX may, for example, assume voltage values of 0 V and 3.6 V, when they are respectively equal to '0' and to '1'.

This having been said, with reference to the step of reading of the memory array 3, and in particular assuming, for example, that reference is made to the step of reading memory cells 2 arranged along a k-th wordline WL of the j-th subset of wordlines WL that traverse the group of tiles 16, what is described hereinafter occurs. As regards operation of the local row-decoding stages, the ensuing treatment is initially limited to the description of the first local row-decoding stage 30'.

Initially, all the wordlines WL are deselected; for this purpose, the main row-decoding unit 28 has previously set SECT_PX<j>='0', SECT_NPX='1' and SECT_LX<i>='0' for i=0, . . . 31. Moreover, in a per se known manner, the main row-decoding unit 28 sets the node $NV_{read/write}$ at a voltage $V_{read}$, which is, for example, equal to 1.6 V and can be lower than the voltage $V_{write}$, the latter being the voltage that is set by the main row-decoding unit 28 on the node $NV_{read/write}$ during writing. For instance, the voltage $V_{write}$ may be equal to 3.6 V.

Consequently, with reference to the k-th wordline WL, the corresponding wordline-selection transistor $M_{nk}$ and the group-selection transistor $M_n$ are inhibited, so as to decouple the wordline WL from the ground reference voltage GND; instead, the corresponding wordline-deselection transistor $M_{p0,k}$ and the corresponding group-deselection transistor $M_{p1,k}$ are on (i.e., above threshold), in such a way that the wordline WL is set at a voltage $V_{high}$, approximately equal to the voltage $V_{read}$, thus causing deselection of the wordline WL. Moreover, also the corresponding additional pull-up transistor $M_{pu,k}$ is above threshold, since SECT_NPX<j>='1'.

Next, in order to select the k-th wordline WL, the main row-decoding unit 28 sets SECT_PX<j>='1', SECT_NPX<j>='0', SECT_LX<k>='1' and keeps SECT_LX<i>='0' for every i different from k. This entails what is described below.

All the additional pull-up transistors $M_{pu,0}$-$M_{pu,31}$ are inhibited, since SECT_NPX<j>='0'; likewise, all thirty-two group-deselection transistors $M_{p1,0}$-$M_{p1,31}$ are inhibited, since SECT_PX<j>='1'. Moreover, all the wordlines WL other than the k-th wordline WL remain deselected, at the voltage $V_{high}$. In fact, with reference to the i-th wordline WL (with i different from k), it is found that the corresponding wordline-deselection transistor $M_{p0,i}$ and the corresponding wordline-selection transistor $M_{ni}$ are respectively above threshold and inhibited, because SECT_LX<i>='0'. In particular, the fact that the wordline-selection transistor $M_{ni}$ is inhibited causes the i-th wordline WL to be decoupled from the ground reference voltage GND, notwithstanding the fact that the group-selection transistor $M_n$ is above threshold in so far as SECT_PX<j>='1'. Moreover, the wordline-deselection transistor $M_{p0,i}$ keeps the i-th wordline WL connected to the node $NV_{read/write}$; the i-th wordline WL therefore remains at the voltage $V_{high}$.

The k-th wordline WL is, instead, selected; i.e., is brought to a voltage Vow equal, to a first approximation, to the ground reference voltage GND, since the corresponding wordline-selection transistor $M_{nk}$ is above threshold (in so far as SECT_LX<k>='1') and forms, together with the group-selection transistor $M_n$, a connection towards the ground reference voltage GND; moreover, the k-th wordline WL is decoupled from the node $N_{read/write}$, since the corresponding group-deselection transistor $M_{p1,k}$, the corresponding wordline-deselection transistor $M_{p0,k}$, and the corresponding additional pull-up transistor $M_{p0,k}$ are inhibited. In particular, the corresponding wordline-deselection transistor $M_{p0,k}$ is inhibited because SECT_LX<k>='1'.

Once again with reference to the group-deselection transistor $M_{p1,k}$ and to the wordline-deselection transistor $M_{p0,k}$, they form, for practical purposes, a logic circuit of a NAND type, which is configured to couple the k-th wordline WL to the node $NV_{read/write}$, and thus to set on the k-th wordline WL the aforementioned voltage $V_{high}$, in the case where at least one of the address-decoding signal SECT_PX<j> and the address-decoding signal SECT_LX<k> is equal to '0', i.e., whenever the k-th wordline WL is not selected.

In practice, when the k-th wordline WL is selected, it is found that, for every i different from k, the i-th wordline-deselection transistor $M_{p0,i}$ remains above threshold, causing the i-th wordline WL to remain deselected, at the voltage $V_{high}$; only the k-th wordline WL is brought to the voltage $V_{low}$ in so far as it is decoupled from the node $NV_{read/write}$ and coupled to the ground reference voltage GND.

Following upon reading of the memory cells 2 coupled to the k-th wordline WL, which can occur in a per se known manner, the k-th wordline WL is again deselected; i.e., it is brought back to the voltage $V_{high}$. For this purpose, the address-decoding signals SECT_PX<j> and SECT_NPX<j> are respectively set at '0' and at '1', and the address-decoding signal SECT_LX<k> is set again equal to '0', whereas the address-decoding signals SECT_LX<i> (with i different from k) remain equal to '0'. In particular, the fact that the address-decoding signals SECT_PX<j> and SECT_LX<k> are set at '0' causes inhibition of the wordline-selection transistor $M_{nk}$ and the group-selection transistor $M_n$, thus decoupling the k-th wordline WL from the ground reference voltage GND, and moreover causes the wordline-deselection transistor $M_{p0,k}$ and the group-deselection transistor $M_{p1,k}$ to go above threshold, thus coupling the k-th wordline WL to the node $NV_{read/write}$. In addition, the fact that the address-decoding signal SECT_NPX<j> is set equal to '1' causes the thirty-two additional pull-up transistors $M_{pu,0}$-$M_{pu31}$ to go above threshold; however, only the k-th additional pull-up transistor $M_{pu,k}$ is effectively traversed by current (together with the wordline-deselection transistor $M_{p0,k}$ and the group-deselection transistor in order to enable the k-th wordline WL to increase locally its own voltage up to the voltage $V_{high}$. In fact, as explained previously, all thirty-one wordlines WL other than the k-th wordline WL are already at the voltage $V_{high}$ since the corresponding wordline-deselection transistors $M_{p0,i}$ (with i different from k) have remained above threshold.

In practice, even assuming that, within the shared pull-up stage 29, as well as within the local pull-down stage 31 and the local pull-up stage 32 of the first local row-decoding stage 30', transistors of the high-voltage type are adopted, what is described hereinafter occurs.

Since the k-th additional pull-up transistor $M_{pu,k}$ is an NMOS transistor, it enables deselection of the k-th wordline WL much more rapidly than the wordline-deselection transistor $M_{p0,k}$ and the group-deselection transistor $M_{p1,k}$ could do in the presence of a relatively low voltage $V_{read}$ (as has been said previously, equal, for example, to 1.6 V). In fact, the additional pull-up transistor $M_{p0,k}$ benefits from the high mobility of the charge carriers typical of NMOS transistors and of the high gate-to-source voltage (in the present example, approximately equal to 2 V, notwithstanding the low value of $V_{read}$), and therefore enables fast deselection of the k-th wordline WL, bringing it to a voltage $V_{high}$ that is in any case contained, with consequent benefits in terms of reduction of the static and dynamic leakage. Since the shared pull-up stage 29 is not required to manage rapid deselection of the wordline WL, the wordline-deselection transistor $M_{p0,k}$ and the group-deselection transistor $M_{p1,k}$ can be of the high-voltage type and with channels that have limited widths since they do not have to handle high currents, but rather are limited to functioning as buffers for selection of the k-th wordline WL. Moreover, during writing, and therefore when the aforementioned voltage $V_{write}$ is present on the node $NV_{read/write}$, the wordline-deselection transistor $M_{p0,k}$ and the group-deselection transistor $M_{p1,k}$ manage to bring the k-th wordline WL, when deselected, approximately to the voltage $V_{write}$, albeit having on their own gate terminals voltages not higher than 3.6 V (according to the present example). This task cannot be performed by the additional pull-up transistor $M_{p0,k}$, unless it is driven with a gate voltage that is decidedly higher (in the present example, in the region of 6 V).

As concerns the second local row-decoding stage 30'', it functions in the same way as the first local row-decoding stage 30' since it is the same as the latter and receives the same signals. However, considering generically a k-th wordline WL, the local pull-down stage 31 and the k-th additional pull-up transistor $M_{p0,k}$ of the first local row-decoding stage 30' contact a first point of the k-th wordline WL set on the left (with reference to the orientation illustrated in FIG. 4) of the first tile 6', said first point being moreover coupled to the k-th wordline-deselection transistor $M_{p0,k}$ and to the k-th group-deselection transistor $M_{p1,k}$, whereas the local pull-down stage 31' and the k-th additional pull-up transistor $M'_{pu,k}$ of the second local row-decoding stage 30'' contact a second point of the k-th wordline WL that is located between the first and second tiles 6', 6''. The aforementioned first and second points of the k-th wordline WL represent, respectively, a first node and a second node of the k-th wordline WL, which are distributed along the latter; in greater detail, apart from the first node, which coincides with the end of the k-th wordline WL facing the shared pull-up stage 29, the second node and the further nodes (not illustrated) of the k-th wordline WL contacted by the subsequent local row-decoding stages (not illustrated) are each arranged between a corresponding pair of adjacent tiles. In other words, considering the k-th wordline WL, the local pull-down stage and the local pull-up stage of each local row-decoding stage are coupled to a same node of the k-th wordline WL, arranged upstream of a corresponding tile.

The shared pull-up stage 29 is shared between the tiles of the group of tiles 16, is set on one side of the group of tiles 16, and functions as a logic circuit that decouples/couples the wordline WL selected/deselected by the node $NV_{read/write}$, and in particular decouples/couples corresponding ends of the wordline WL. The local pull-down stages 31,31' locally couple to/uncouple from the ground reference voltage GND the wordline selected/deselected, and in particular couple/uncouple corresponding nodes arranged along the wordline WL; in other words, the local pull-down stages 31,31' are spatially distributed along the group of tiles 16. Also the local pull-up stages 32,32' are spatially distributed along the group of tiles 16 and are controlled so as to restore rapidly the voltage $V_{high}$ in the corresponding nodes of the wordline WL; in this way, the wordlines WL are not deselected by just the shared pull-up stage 29, which would lead to delays and lack of voltage uniformity, on account of the parasitic resistances and capacitances distributed along each wordline WL.

The advantages of the present solution emerge clearly from the foregoing description. In this connection, it should again be noted how, according to the present solution, the local row-decoding stages are formed by just NMOS transistors, with consequent benefit in terms of reduction of area, since provision of a corresponding well of an N type for the formation of PMOS transistors within the local row-decoding stages is not required.

In addition, since selective decoupling of just the wordline selected by the $NV_{read/write}$ node is performed by the shared pull-up stage 29, while the local pull-up stages 32,32' simply restore the voltage $V_{high}$ in corresponding points of the wordline WL previously selected, each local pull-up stage can include only one additional pull-up transistor $M_{p0,k}$ for each wordline WL, with consequent further saving of area. In fact, considering, for example, the k-th wordline and the local pull-up stage 32 of the first local row-decoding stage 30', the latter does not require the presence of a pair of corresponding NMOS transistors driven by signals that are complementary with respect to the signals that drive the group-deselection transistors $M_{p1,k}$ and the wordline-deselection transistor $M_{p0,k}$, but rather the presence of just the additional pull-up transistor $M_{p0,k}$ is sufficient.

Figure 5:
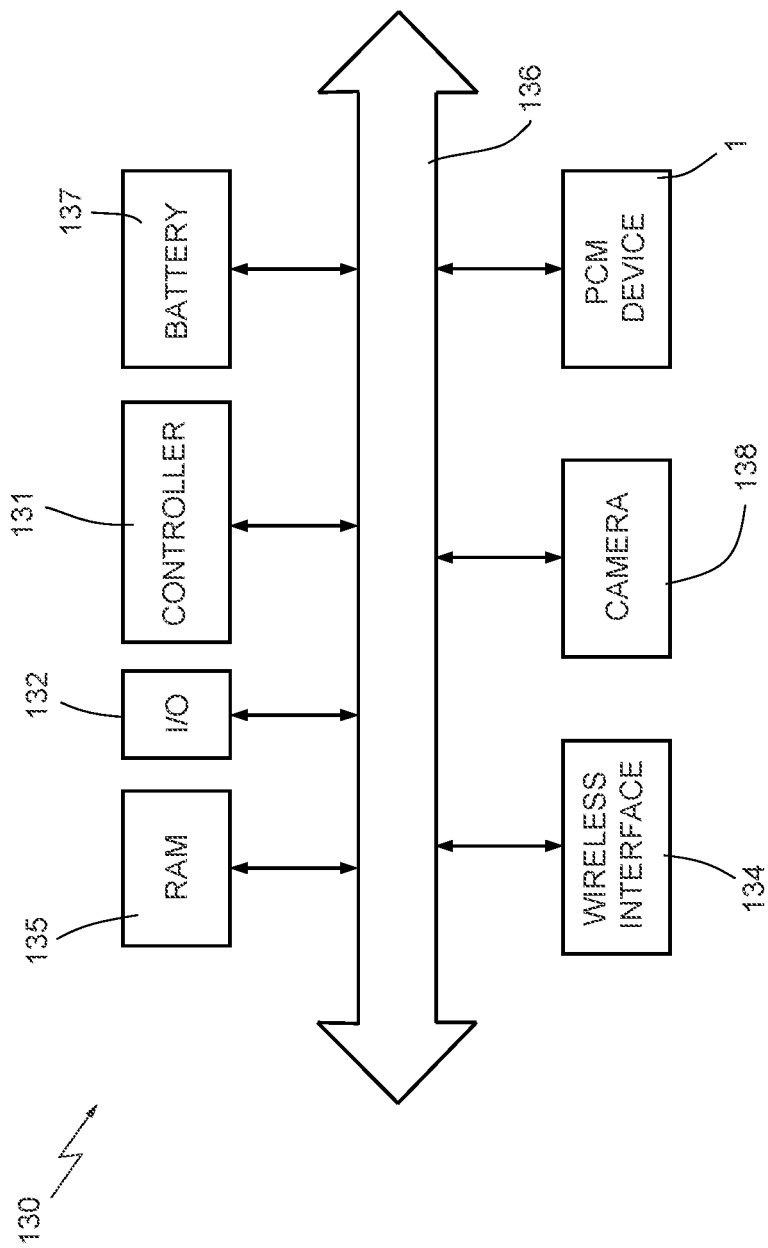
FIG. 5 shows a simplified block diagram of an electronic system incorporating the present memory device.

The aforesaid advantages render particularly advantageous the use of the non-volatile memory device 1 in an electronic system 130, as illustrated schematically in FIG. 5.

The electronic system 130 can be used in electronic devices, such as: a PDA (Personal Digital Assistant); a portable or fixed computer, possibly with wireless data-transfer capacity; a mobile phone; a digital audio player; a photographic camera or video camera; or further portable devices capable of processing, storing, transmitting, and receiving information.

In detail, the electronic system 130 comprises the non-volatile memory device 1 and a controller 131 (for example, provided with a microprocessor, a DSP, or a microcontroller), both coupled to a bus 136 designed to route signals (for example, for address selection) towards the non-volatile memory device 1.

Moreover, the electronic system 130 may optionally comprise, coupled to the bus 136, one or more of the following: an input/output device 132 (for example, provided with a keyboard and a display), for entering and displaying data; a wireless interface 134, for example an antenna, for transmitting and receiving data through a radiofrequency wireless communication network; a RAM 135; a battery 137, which can be used as electric power source in the electronic system 130; and a photographic camera and/or a video camera 138.

Finally, it is clear that modifications and variations may be made to what has been described and illustrated herein, without thereby departing from the scope of the present invention, as defined in the annexed claims.

For instance, the shared pull-up stage 29 may be different from what has been described; for example, the aforementioned NAND circuit formed by each pair constituted by the wordline-deselection transistor $M_{p0,k}$ and by the corresponding group-deselection transistors $M_{p1,k}$ can be replaced by a different circuit that performs the same function and is again formed just by PMOS transistors.

Likewise, for the row decoding, different and/or further row-address-decoding signals could be used with respect to what has been illustrated; moreover, a different mode of combination of the address-decoding signals could be used.

In addition, the first local row-decoding stage 30' could be without the respective local pull-up stage 32 since the latter is coupled to the ends of the wordline WL, to which also the shared pull-up stage 29 is coupled; however, in this case the shared pull-up stage 29 should be formed by larger PMOS transistors so as to guarantee the same deselection rate.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A non-volatile memory device, comprising:
   a memory array including a plurality of memory portions, each memory portion comprising a respective plurality of memory cells arranged in rows and columns, wherein the memory portions are arranged in groups, each group of memory portions comprising a plurality of respective memory portions arranged in a row and a plurality of respective wordlines that extend through the respective memory portions, and wherein the memory cells of the memory portions of the group are coupled to the respective wordlines; and
   a row decoder comprising a pre-decoding stage configured to execute a selection, in which it selects a wordline that extends through a group of memory portions and deselects other wordlines that extend through the group of memory portions, and a subsequent deselection, in which it deselects all the wordlines that extend through the group of memory portions, the row decoder further comprising, for each group of memory portions:
      a shared pull-up stage configured to decouple from or couple to a node at a first reference potential each wordline that extends through the group of memory portions, when the wordline is respectively selected or deselected, to impose on each wordline, when deselected, a deselection voltage,
      a plurality of pull-down stages distributed along the group of memory portions, each pull-down stage being configured to locally couple each wordline that extends through the group of memory portions, when selected, to a node at a second reference potential, to impose locally a selection voltage on the wordline, wherein each pull-down stage is further configured to locally decouple from the node at the second reference potential each wordline that extends through the group of memory portions, when deselected, and
      a number of local pull-up stages distributed along the group of memory portions, each local pull-up stage comprising, for each wordline that extends through the group of memory portions, a corresponding local pull-up transistor of an NMOS type, wherein the local pull-up transistors of each local pull-up is being configured to:
         locally decouple the corresponding wordline from the node at the first reference potential when one of the wordlines that extend through the group of memory portions is selected; and
         locally couple the corresponding wordline to the node at the first reference potential when all the wordlines that extend through the group of memory portions are deselected to restore locally the deselection voltage on the wordline previously selected.

2. The non-volatile memory device according to claim 1, wherein, for each group of memory portions, the corresponding shared pull-up stage comprises, for each wordline that extends through the group of memory portions, a corresponding deselection logic circuit comprising a number of respective PMOS transistors, which are coupled to the wordline and the node at the first reference potential.

3. The non-volatile memory device according to claim 2, wherein each deselection logic circuit comprises a respective first PMOS transistor and a respective second PMOS transistor, each of which has conduction terminals respectively coupled to the corresponding wordline and the node at the first reference potential, and wherein each deselection logic circuit is configured to:
   turn on the respective first PMOS transistor when the corresponding wordline is deselected;
   turn off the respective first PMOS transistor when the corresponding wordline is selected; and
   turn off the respective second PMOS transistor when one of the wordlines that extend through the group of memory portions is selected and turn on the respective second PMOS transistor otherwise.

4. The non-volatile memory device according to claim 1, wherein, for each group of memory portions, the corresponding wordlines extend through the memory portions of the group starting from the corresponding shared pull-up stage.

5. The non-volatile memory device according to claim 4, wherein each pull-down stage is coupled to a corresponding node of each wordline that extends through the group of memory portions, the nodes of each wordline coupled to the pull-down stages being arranged upstream of corresponding memory portions, wherein each pull-down stage is configured to couple the corresponding node of each wordline, when selected, to the node at the second reference potential, and to decouple the corresponding node of each wordline, when deselected, from the node at the second reference potential.

6. The non-volatile memory device according to claim 5, wherein, in each local pull-up stage, each local pull-up transistor has conduction terminals respectively coupled to the node at the first reference potential and to the node of the corresponding wordline to which a corresponding pull-down stage is coupled.

7. The non-volatile memory device according to claim 1, wherein each memory cell comprises a respective selector and a respective phase-change element configured to provide a first or a second resistance value associatable to corresponding logic data.

8. The memory device according to claim 7, wherein the selector is a bipolar transistor.

9. A decoding method for a non-volatile memory device comprising a memory array including a plurality of memory portions, each memory portion comprising a respective plurality of memory cells arranged in rows and columns, wherein the memory portions is arranged in groups, each group of memory portions comprising a plurality of respective memory portions arranged in a row and a plurality of respective wordlines that extend through the respective memory portions, and wherein the memory cells of the memory portions of the group is coupled to the respective wordlines, the method comprising:

selecting, by a pre-decoding stage, a wordline that extends through a group of memory portions and deselecting the other wordlines that extend through the group of memory portions;

subsequently deselecting all the wordlines that extend through the group of memory portions; and executing for each group of memory portions, wherein executing comprises:

decoupling from or coupling to, by a shared pull-up stage, a node at a first reference potential each wordline that extends through the group of memory portions when the wordline is respectively selected or deselected to impose on each wordline, when deselected, a deselection voltage;

locally coupling, by each pull-down stage of a plurality of pull-down stages distributed along the group of memory portions, each wordline that extends through the group of memory portions when selected, to a node at a second reference potential to impose locally a selection voltage on the wordline;

locally decoupling, by each pull-down stage of the plurality of pull-down stages from the node at the second reference potential, each wordline that extends through the group of memory portions when deselected;

controlling a number of local pull-up stages distributed along the group of memory portions, each local pull-up stage comprising, for each wordline that extends through the group of memory portions, a corresponding local pull-up transistor of an NMOS type, wherein controlling comprises:

controlling the local pull-up transistors of each local pull-up stage so that the local pull-up transistors locally decouple the corresponding wordlines from the node at the first reference potential when one of the wordlines that extend through the group of memory portions is selected; and controlling the local pull-up transistors of each local pull-up stage so that the local pull-up transistors locally couple the corresponding wordlines to the node at the first reference potential when all the wordlines that extend through the group of memory portions are deselected to restore locally the deselection voltage on the wordline previously selected.

10. The decoding method according to claim 9, wherein, for each group of memory portions, the corresponding shared pull-up stage comprises, for each wordline that extends through the group of memory portions, a corresponding deselection logic circuit, which comprises a number of respective PMOS transistors, and which are coupled to the wordline and to the node at the first reference potential.

11. The decoding method according to claim 9, wherein, for each group of memory portions, the corresponding wordlines extend through the memory portions of the group starting from the corresponding shared pull-up stage, wherein each pull-down stage is coupled to a corresponding node of each wordline that extends through the group of memory portions, the nodes of each wordline coupled to the pull-down stages being arranged upstream of corresponding memory portions, wherein locally coupling each wordline selected to the node at the second reference potential comprises coupling to the node at the second reference potential, by the pull-down stages, the corresponding nodes of the wordline selected; and wherein locally decoupling each wordline deselected from the node at the second reference potential comprises decoupling, by the pull-down stages, the corresponding nodes of each wordline deselected.

12. The decoding method according to claim 11, wherein, in each local pull-up stage, each local pull-up transistor has conduction terminals respectively coupled to the node at the first reference potential and to the node of the corresponding wordline to which a corresponding pull-down stage is coupled.

13. A system comprising:
a controller;
a bus;
a non-volatile memory device coupled to the controller through the bus, the non-volatile memory device comprising:

a memory array including a plurality of memory portions, each memory portion comprising a respective plurality of memory cells arranged in rows and columns, wherein the memory portions are arranged in groups, each group of memory portions comprising a plurality of respective memory portions arranged in a row and a plurality of respective wordlines that extend through the respective memory portions, and wherein the memory cells of the memory portions of the group are coupled to the respective wordlines; and a row decoder comprising a pre-decoding stage configured to execute a selection, in which it selects a wordline that extends through a group of memory portions and deselects other wordlines that extend through the group of memory portions, and a subsequent deselection, in which it deselects all the wordlines that extend through the group of memory portions, the row decoder further comprising, for each group of memory portions:

a shared pull-up stage configured to decouple from or couple to a node at a first reference potential each wordline that extends through the group of memory portions, when the wordline is respectively selected or deselected, to impose on each wordline, when deselected, a deselection voltage, a plurality of pull-down stages distributed along the group of memory portions, each pull-down stage being configured to locally couple each wordline that extends through the group of memory portions, when selected, to a node at a second reference potential, so as to impose locally a selection voltage on the wordline, wherein each pull-down stage is further configured to locally decouple from the node at the second reference potential each wordline that extends through the group of memory portions, when deselected, and a number of local pull-up stages distributed along the group of memory portions, each local pull-up stage comprising, for each wordline that extends through the group of memory portions, a corresponding local pull-up transistor of an NMOS type, wherein the local pull-up transistors of each local pull-up is being configured to:

locally decouple the corresponding wordline from the node at the first reference potential when one of the wordlines that extend through the group of memory portions is selected; and locally couple the corresponding wordline to the node at the first reference potential when all the wordlines that extend through the group of memory portions are deselected to restore locally the deselection voltage on the wordline previously selected.

14. The system of claim 13, wherein, for each group of the memory portions, the corresponding shared pull-up stage comprises, for each wordline that extends through the group of memory portions, a corresponding deselection logic circuit comprising a number of respective PMOS transistors, which are coupled to the wordline and the node at the first reference potential.

15. The system of claim 14, wherein each deselection logic circuit comprises a respective first PMOS transistor and a respective second PMOS transistor, each of which has conduction terminals respectively coupled to the corresponding wordline and the node at the first reference potential, and wherein each deselection logic circuit is configured to:
turn on the respective first PMOS transistor when the corresponding wordline is deselected;
turn off the respective first PMOS transistor when the corresponding wordline is selected; and
turn off the respective second PMOS transistor when one of the wordlines that extend through the group of memory portions is selected and turn on the respective second PMOS transistor otherwise.

16. The system of claim 15, wherein, for each group of memory portions, the corresponding wordlines extend through the memory portions of the group starting from the corresponding shared pull-up stage.

17. The system of claim 16, wherein each pull-down stage is coupled to a corresponding node of each wordline that extends through the group of memory portions, the nodes of each wordline coupled to the pull-down stages being arranged upstream of corresponding memory portions, wherein each pull-down stage is configured to couple the corresponding node of each wordline, when selected, to the node at the second reference potential, and to decouple the corresponding node of each wordline, when deselected, from the node at the second reference potential.

18. The system of claim 17, wherein, in each local pull-up stage, each local pull-up transistor has conduction terminals respectively coupled to the node at the first reference potential and to the node of the corresponding wordline to which a corresponding pull-down stage is coupled.

19. The system of claim 13, wherein each memory cell comprises a respective selector and a respective phase-change element configured to provide a first or a second resistance value associatable to corresponding logic data.

20. The system of claim 19, wherein the selector is a bipolar transistor.

* * * * *